United States Patent [19]

Croker

[11] 4,210,081

[45] Jul. 1, 1980

[54] PLANOGRAPHIC PRINTING PLATE AND PROCESS FOR MAKING THE SAME

[75] Inventor: John H. Croker, Broxbourne, England

[73] Assignee: Gastetner Limited, London, England

[21] Appl. No.: 904,930

[22] Filed: May 10, 1978

[30] Foreign Application Priority Data

May 12, 1977 [GB] United Kingdom ............... 20041/77

[51] Int. Cl.² .......................... B41N 3/00; G03F 7/10
[52] U.S. Cl. .................................. 101/465; 427/391;
 428/342; 428/503; 428/530; 428/913; 430/302;
 430/524; 430/531
[58] Field of Search ....................... 101/462, 465, 463;
 96/33, 67; 427/385 R, 391; 428/342, 530, 503,
 913

[56] References Cited

U.S. PATENT DOCUMENTS

| 2,550,326 | 4/1951 | Brown ....................... 96/33 |
| 2,931,742 | 4/1960 | Hicks ....................... 427/385 R |
| 3,357,352 | 12/1967 | Williams, Jr. et al. ............... 101/462 |
| 3,437,034 | 4/1969 | Otto et al. .................... 101/463 |
| 3,608,489 | 9/1971 | Croker ....................... 101/462 |
| 3,979,478 | 9/1976 | Gallacher .................... 427/391 X |
| 4,091,130 | 5/1978 | Shaw ........................ 427/391 X |

*Primary Examiner*—Michael F. Esposito
*Assistant Examiner*—Thurman K. Page
*Attorney, Agent, or Firm*—Cushman, Darby & Cushman

[57] ABSTRACT

Planographic printing plates are made by depositing on a support sheet an aqueous mixture comprising a hydroxyl group-containing polymer free from acid groups, an insolubilizing agent, a synthetic polymer containing acid groups and preferably a filler, and then drying the deposited layer.

The process can be operated at near ambient temperature to give rapidly and reliably a durable water-insoluble hydrophilic layer.

13 Claims, No Drawings

PLANOGRAPHIC PRINTING PLATE AND PROCESS FOR MAKING THE SAME

This invention relates to planographic printing plates and their production.

In the manufacture of planographic printing plates for lithography, it is common practice to coat a flexible support sheet, often but not necessarily of paper, and which may be pre-coated, with a mixture of one or more water-soluble polymeric binders and fillers dispersed in water, and then dry the coating. After the coating operation, the layer must become insoluble in water in order that it shall be able to withstand the aqueous fountain solution used in lithography and provide large numbers of copies in use. It is, of course, also necessary that the insolubilised coating shall remain hydrophilic and ink-repellent in use except in those areas, the image areas, which have been rendered oleophilic and ink-receptive.

The various methods which have been proposed for producing such water-insoluble coatings have not proved completely satisfactory, either because they are unreliable, or because they require expensive equipment, or both.

In our British Specification No. 1159293, we have described and claimed a planographic printing plate which comprises a support sheet carrying a layer formed by the reaction of a water-soluble urea- or melamine-formaldehyde resin precursor with a water-soluble synthetic polymer colloid containing free acid groups. After the mixture has been coated on the support sheet, the coating may be dried at a temperature above 80° F. (27° C.) and preferably above 200° F. (93° C.), but below the decomposition temperature of the resin precursor and the colloid. During the drying, the colloid and the resin precursor react together to produce a water-insoluble hydrophilic surface, which is very durable under lithographic printing conditions and is capable of withstanding long printing runs. However, it is not possible satisfactorily to insolubilise the coating at temperatures near ambient temperature within a reasonably short time.

The present invention provides a planographic printing plate which can be made by coating and drying a composition at temperatures near ambient temperature with the rapid and reliable production of a durable, water-insoluble hydrophilic layer.

The planographic printing plate of the present invention is made by depositing on a support sheet a layer of an aqueous mixture having a pH of 2 to 5.5, preferably 3 to 5.5, comprising in solution a hydroxyl group-containing polymer free from acid groups, an insolubilising agent which is preferably a water-soluble urea- or melamine-formaldehyde resin precursor, and a synthetic organic polymer containing free acid groups, and then evaporating the water from the deposited layer, usually at a temperature below 112° F. (44° C.) and preferably at 68° F. (20° C.) to 86° F. (30° C.). The polymer containing free acid groups is the sole polymer necessary to ensure rapid insolubilisation of the layer, but it may sometimes be desirable to include another acid in the aqueous mixture for another purpose, e.g. chromic acid as an additional hardener for the hydroxyl group-containing polymer.

The proportion of the synthetic organic polymer containing free acid groups is preferably from 10% to 50% by weight of the polymer free from acid groups, and the insolubilising agent is preferably present in an amount from 5 to 25% by weight of the polymer free from acid groups.

The mixture preferably contains a filler which is unreactive with the free acid groups present in the synthetic polymer, for example, china clay, titanium dioxide, blanc fixe or silica, in a weight ratio of filler to total binder solids (i.e. the hydroxyl group-containing polymer plus the insolubilising agent plus the synthetic organic polymer containing free acid groups) of 10:1 to 1:1, and preferably about 4:1. Fillers which react with the acid groups present in the synthetic polymer, for example, hydrated alumina, calcium carbonate, or zinc oxide, should be avoided. The total proportion of solids in the aqueous mixture is preferably from 3 to 15% by weight based on the total weight of water plus binder solids plus filler.

The hydroxyl group-containing polymer may be any polymer which is free from acid groups and soluble in water at a pH in the range of 2 to 5.5. Thus, for example, it may be an alkyl cellulose containing free hydroxyl groups such as methylcellulose, ethylcellulose or hydroxyethylcellulose, but it is preferably polyvinyl alcohol, in which not more than 12 mol % of the hydroxyl groups are acetylated. Preferably, the acetyl group content should be as low as possible and usually not greater than 1%. The molecular weight should be as high as is consistent with satisfactory coating performance. In general, all commercially available polymers satisfy this criterion.

The preferred insolubilising agents are water-soluble melamine-formaldehyde resin precursors, for example, hexamethoxymethyl-melamine and trimethoxymethyl-melamine. Such products are commercially available. As an alternative to urea- or melamine-formaldehyde resin precursors, it is possible to use other insolubilising agents such as mono- and di-aldehydes, e.g. formaldehyde or glyoxal.

The synthetic polymer containing free acid groups must be such as to give (without any other acid) a solution having a pH within the range 2 to 5.5 when dissolved in water. The preferred such polymer is polymethacrylic acid, though copolymers of acrylamide and acrylic acid, hydrolysed vinyl ether/maleic anhydride copolymers, polyacrylic acid, and other synthetic polymers containing free acid groups can also be used. In the case of the preferred polymethacrylic acid, the molecular weight is preferably in the range 5000–30000 and in the case of polyacrylic acid the molecular weight is preferably $27000-13.9\times10^6$. The molecular weight must of course be such that the aqueous mixture has a viscosity satisfactory for coating.

The support sheet may be of any kind conventionally used for planographic printing plates, e.g. wet strengthened paper, and may be pre-coated with a conventional subbing layer. The weight of the paper and the coating weight are chosen to be adequate for the length of run for which the planographic printing plates are designed to be used. Ordinarily, the coating weight is in the range of 5 to 30 grams of solids per square meter of support.

To produce a planographic printing plate in accordance with the present invention, a mixture is prepared containing in aqueous solution, the neutral polymer, the acid polymer and the insolubilising agent with the filler dispersed therein. The mixture is then coated by a conventional procedure onto the support sheet. The coating must be carried out before substantial reaction between the insolubilising agent and the polymers has taken place, but there is usually no difficulty in this. After the mixture has been coated onto the support sheet, the coating is dried, preferably at, or slightly above, ambient temperature. During the drying, the polymers and the insolubilsing agent react together to produce a water-insoluble hydrophilic layer which is very durable under lithographic printing conditions and capable of withstanding long printing runs. It is an important advantage of the present invention that the layer becomes sufficiently water-insoluble to be used immediately it is dry. This greatly facilitates control of the manufacture of the planographic printing plates, since the need for artificial ageing or storage of the plates before they are used is dispensed with.

The planographic printing plates of the invention are suitable for imaging by indirect xerography as well as by ordinary direct imaging techniques for planographic printing plates.

The following Examples illustrate the invention:

EXAMPLE I

A mixture is prepared of water (180 parts by weight), china clay (72 parts by weight), polyvinyl alcohol (Kurashiki Poval Grade H, 99.8% hydrolysed viscosity 22-28 cps as a 4% aqueous solution at 20° C.; 16 parts by weight), 25% aqueous polymethacrylic acid (Allied Colloids Versicol K13, molecular weight about 26000; 20 parts by weight), and a methylated melamine-formaldehyde precondensate (BE 336 of British Industrial Plastics; 2 parts by weight). The mixture so-obtained, in which the china clay is the only insoluble ingredient, is then coated on a wet strengthened paper of the kind ordinarily used as a support sheet for planographic printing plates as a coating weight of about 15 grams per square meter. The coating is dried at ambient temperature of slightly above (e.g. at 20° to 30° C.) and is then immediately ready for use as a direct image offset plate after imaging in the usual manner. Provided a suitable base sheet is used, the plate surface can withstand runs as long as 5000 copies under ordinary lithographic printing conditions.

In place of the resin BE 336, Cymel 301 sold by Cyanamid of Great Britain, which is hexamethoxymethyl-melamine, can also be used.

EXAMPLE II

| | |
|---|---|
| Water | 250 |
| Polyvinyl alcohol (E.I. du Pont de Nemours & Co., Elvanol 90-50, 99-99.8% hydrolysed, viscosity 12-14 centipoises as a 4% aqueous solution at 20° C.) | 16 |
| China Clay | 72 |
| TiO$_2$ | 16 |
| Polyacrylic acid (Allied Colloids Ltd., Versicol E11 molecular weight 230,000) | 20 |
| BE336 | 2 |
| Chromic Acid | 0.1 |

EXAMPLE III

| | |
|---|---|
| Water | 250 |
| Polyvinyl alcohol (Nippon Gohsei Gohsenol NM11, 99-100% hydrolysed, viscosity 13-16 centipoises as a 4% aqueous solution at 20° C.) | 16 |
| China Clay | 72 |
| Silica | 5 |
| Polymethacrylic acid (Allied Colloids Versicol K11, molecular weight 10000) | 12 |
| BE336 | 1.8 |

Mixtures having the compositions specified in Examples II and III may be made up and coated onto a support sheet as described in Example I. The plates so obtained are similar to that described in Example I.

We claim:

1. A process for the production of a planographic printing plate which comprises the steps of
   (1) depositing on a support sheet a layer of an aqueous mixture having a pH of 2 to 5.5 consisting, in solution, a hydroxyl group-containing polymer free from acid groups, an insolubilising agent, and a synthetic organic polymer containing free acid groups, and thereafter
   (2) evaporating the water from the deposited layer.

2. Process according to claim 1 in which the said aqueous mixture also comprises a filler which is unreactive with the free acid groups present in the synthetic polymer.

3. Process according to claim 2 in which the filler is china clay.

4. Process according to claim 1 in which the total proportion of solids in the aqueous mixture is from 3 to 15% by weight.

5. Process according to claim 1 in which the pH of the aqueous mixture used is 3 to 5.5.

6. Process according to claim 1 in which the insolubilizing agent used is a water-soluble urea- or melamine-formaldehyde resin precursor.

7. Process according to claim 6 in which the insolubilizing agent used is hexamethoxymethyl-melamine or trimethoxymethyl-melamine.

8. Process according to claim 1 in which in the aqueous mixture used the proportion of the synthetic organic polymer containing free acid groups is 10 to 50% by weight of the polymer free from acid groups and the proportion of the insolubilizing agent is 5 to 25% by weight of the polymer free from acid groups.

9. Process according to claim 1 in which in the aqueous mixture used the polymer free from acid groups is polyvinyl alcohol in which not more than 12 mol % of the hydroxyl groups are acetylated.

10. Process according to claim 9 in which, in the polyvinyl alcohol used, the acetyl content is not more than 1%.

11. Process according to claim 1 in which in the aqueous mixture used the synthetic organic polymer containing free acid groups is polymethacrylic acid having a molecular weight of 5000–30000 or polyacrylic acid having a molecular weight of 27000 to $13.9 \times 10^6$.

12. Process according to claim 1 in which water is evaporated from the deposited layer at below 112° F.

13. Process according to claim 1 for the production of a planographic printing plate which comprises depositing on a wet-strengthened paper support sheet a layer of an aqueous mixture having a pH of 3 to 5.5, comprising, in solution, (1) polyvinyl alcohol in which not more than 12 mol % of the hydroxyl groups are acetylated, (2) 5 to 25% by weight, based on the polyvinyl alcohol, of hexamethoxymethyl-melamine or trimethoxymethyl-melamine, and (3) 10 to 50% by weight, based on the polyvinyl alcohol, of polymethacrylic acid having a molecular weight of 5000–30000 or polyacrylic acid having a molecular weight of 27000 to $13.9 \times 10^6$, the said mixture having suspended therein a china clay filler in an amount such that the weight ratio of the said filler to the total weight of (1), (2) and (3) is 10:1 to 1:1 and the total proportion of solids in the said aqueous mixture is from 3 to 15% by weight; and evaporating the water from the deposited layer at a temperature below 112° F. so as to give a deposited layer weighing 5 to 30 grams per square meter.